(12) United States Patent
Sreeramaneni et al.

(10) Patent No.: US 7,982,494 B2
(45) Date of Patent: *Jul. 19, 2011

(54) SYSTEMS AND METHODS FOR DETECTING TERMINAL STATE AND SETTING OUTPUT DRIVER IMPEDANCE

(75) Inventors: Raghu Sreeramaneni, Boise, ID (US); Vijay Vankayala, Allen, TX (US); Greg Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/716,822

(22) Filed: Mar. 3, 2010

(65) Prior Publication Data

US 2010/0182014 A1 Jul. 22, 2010

Related U.S. Application Data

(63) Continuation of application No. 12/355,593, filed on Jan. 16, 2009, now Pat. No. 7,696,778.

(51) Int. Cl.
*H03K 17/16* (2006.01)
(52) U.S. Cl. .............................. 326/32; 326/26
(58) Field of Classification Search .................... 326/26, 326/27, 30, 82
See application file for complete search history.

(56) References Cited

U.S. PATENT DOCUMENTS

| | | | |
|---|---|---|---|
| 6,031,385 A | 2/2000 | Ilkbahar | 324/763 |
| 6,262,625 B1 | 7/2001 | Perner et al. | 330/2 |
| 6,807,650 B2 | 10/2004 | Lamb et al. | 716/1 |
| 6,836,143 B2 | 12/2004 | Song | 326/30 |
| 6,839,286 B2 | 1/2005 | Cho et al. | 365/189.05 |
| 6,947,336 B2 | 9/2005 | Kim et al. | 365/189.05 |
| 6,958,613 B2 | 10/2005 | Braun et al. | 324/601 |
| 7,514,954 B2 | 4/2009 | Kim et al. | 326/30 |
| 7,535,250 B2 | 5/2009 | Batt | 326/30 |
| 7,573,288 B2 | 8/2009 | Ayyapureddi et al. | 326/30 |
| 7,804,324 B2 | 9/2010 | Ayyapureddi et al. | 326/30 |
| 2002/0063576 A1 | 5/2002 | Kim et al. | 326/30 |
| 2003/0218914 A1 | 11/2003 | Kim et al. | 365/189.05 |

(Continued)

OTHER PUBLICATIONS

Todd Farrell; "Core Architecture Doubles Mem Data Rate"; EE Times Asia; Dec. 16, 2005; EE Times Asia; eMedia Asia Ltd.; New York, NY; http://www.eetasia.com/MUL_technical-articles_32_TA.HTM.

(Continued)

*Primary Examiner* — Don P Le
(74) *Attorney, Agent, or Firm* — Dorsey & Whitney LLP

(57) ABSTRACT

Embodiments of the present invention include systems for calibrating an output circuit. A comparator is coupled to a calibration terminal and configured to determine whether the calibration terminal is in a first state coupled to a calibration resistor or in a second state. A calibration circuit is coupled to the calibration terminal and configured to generate a calibration value based in part on the presence or absence of the calibration resistor. An impedance selector is coupled to the calibration circuit, the comparator, and a default calibration value. The impedance selector is configured to select the default calibration value when the comparator indicates the calibration terminal is in the second state and to select the calibration value coupled from the calibration circuit when the comparator indicates the calibration terminal is in the first state.

20 Claims, 4 Drawing Sheets

U.S. PATENT DOCUMENTS

| | | | |
|---|---|---|---|
| 2007/0040573 A1 | 2/2007 | Batt | 326/30 |
| 2007/0200591 A1 | 8/2007 | Kim | 326/30 |
| 2007/0263459 A1 | 11/2007 | Kim et al. | 365/189.11 |
| 2009/0146685 A1* | 6/2009 | Kim et al. | 326/33 |
| 2009/0273364 A1* | 11/2009 | Jeong et al. | 326/30 |
| 2009/0295426 A1 | 12/2009 | Ayyapureddi et al. | 326/30 |

OTHER PUBLICATIONS

Graham Allan; "*The Outlook for DRAMs in Consumer Electronics*"; EDA Tech Forum; Jan. 12, 2007; CMP Media LLP; Manhasset, NY; http://edadesignline.com/196900432;jsessionis—IP1AF51SS4QEEQSNDLPCKHSCJUNN2JVN?printableArticle_true.

\* cited by examiner

SYSTEMS AND METHODS FOR DETECTING TERMINAL STATE AND SETTING OUTPUT DRIVER IMPEDANCE

CROSS-REFERENCE TO RELATED APPLICATION

This application is a continuation of pending U.S. patent application Ser. No. 12/355,593 filed Jan. 16, 2009, which application is incorporated by reference herein.

TECHNICAL FIELD

Embodiments of the invention relate generally to semiconductor memory, and particularly to systems and methods for detecting a state of a calibration terminal and setting output driver impedance.

BACKGROUND

Semiconductor devices such as memory devices may include one or more output pins and one or more output buffers to transmitting data to other devices in the system. To improve the transmission of data, the impedance of the transmitting device may be matched to the impedance of the transmission network and receiving device. Impedance matching may allow for higher frequency of data transmission and reduce distortion caused in part by reflections occurring at an interface having an impedance mismatch.

To reduce the effects of impedance mismatches, manufacturing control of the output drivers may be employed to select a precise impedance value to match a transmission network and receiving device. However, manufacturing control can achieve only limited accuracy in matching the impedance value of an output buffer. Accordingly, semiconductor devices may employ a calibration circuit to adjust the impedance of one or more output buffers after the buffers are physically fabricated.

Examples of memory devices including calibration circuits are described in U.S. Published Application Number 2007/0263459 entitled "Method and apparatus for output driver calibration," which publication is hereby incorporated by reference in its entirety. An example of a memory device 10 including an output driver calibration circuit 30 is shown in FIG. 1. The memory device 10 includes a plurality of physical connection terminals 12 for electrically connecting the memory device 10 to other devices within a memory or other system. Various ones of the pins 12 may couple to one or more busses, such as the address bus 14, data bus 16, control bus 18, or combinations thereof. During operation, a memory controller 13 may communicate with the memory device 10. Generally, the memory device 10 includes an array 20 of memory cells coupled to a row decoder 22 and column decoder 24. Responsive to address signals received from the memory controller 13, the row and column decoders 22, 24 may select the appropriate row and column of the memory array 20 for reading or writing as indicated by a command received from the memory controller 13. Data may then be written to or read from the selected memory cell. Data read from the selected memory cell is coupled to the data bus 16 through an output circuit 26 that includes a plurality of output drivers 28.

A calibration circuit 30 adjusts the impedance of one or more of the output drivers 28. The calibration circuit 30 is coupled to a calibration terminal 32 coupled to an external calibration resistor 34. The calibration resistor 34 may be selected responsive to a calibration command received from the memory controller 13, the calibration circuit 30 adjusts the impedance of one or more output drivers 28 based on the voltage at the calibration terminal 32, which is in turn determined by the calibration resistor 34.

An example of an implementation of calibration circuit 30 is shown in FIG. 2. The calibration circuit 30 includes a pull-up driver 202 and a pull-down driver 204. The pull-up driver 202 includes a p-channel variable impedance circuit 62 coupled to the calibration resistor 34 at the calibration terminal 32. The voltage at the calibration terminal is coupled to pull-up calibration logic 54. Responsive to a calibration command, the pull-up driver 202 is turned on, and the pull-up calibration logic may compare the voltage at the calibration terminal 32 with a reference voltage, $V_{ref}$, and adjust the p-channel variable impedance circuit 62 to achieve a desired voltage at the calibration terminal 32. For example, if a power supply voltage 206 is $V_{CCQ}$ and the calibration resistor 34 is coupled to ground, the pull-up calibration logic 54 may adjust the p-channel variable impedance circuit 62 such that the voltage at the calibration terminal 32 is ½ $V_{CCQ}$. Once the p-channel variable impedance circuit 62 of the pull-up driver 202 has been calibrated, the pull-up driver 202 may be coupled to the pull-down driver 204 as shown. A second p-channel variable impedance circuit 82 is adjusted in a similar manner to the p-channel variable impedance circuit 62. The pull-down calibration logic 88 compares a voltage at a node 64 to the reference voltage $V_{ref}$ and adjusts an impedance of an n-channel variable impedance circuit 84. In this manner, the voltage at the node 64 may also be adjusted to equal ½ $V_{CCQ}$.

Based on the adjustments necessary to the p-channel variable impedance circuit 62 and the n-channel variable impedance circuit 84, the pull-up and pull-down calibration logic couple respective control signals 106 and 108 to the output circuit for use in configuring the output impedance of the output buffers.

Accordingly, by coupling a known calibration resistor 34 to the memory device 10, the impedance of output drivers may be adjusted to improve matching with a transmission network, other device coupled to the memory devices, or combinations thereof.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

As described above, a calibration circuit coupled to a calibration resistor may be used to calibrate the impedance of one or more output drivers. This calibration process may be used in high speed memory devices, and may be referred to in the DDR3 and LPDDR2 standards as ZQ calibration, with the calibration terminal referred to as the ZQ pad. While this calibration process may be effective, it may require a user of the electronic device to couple an external calibration resistor to the calibration terminal. In some applications or for some users, a separate calibration may not be needed, and a default calibration setting may be desirable to set the impedance of the output drivers.

Figure 1:
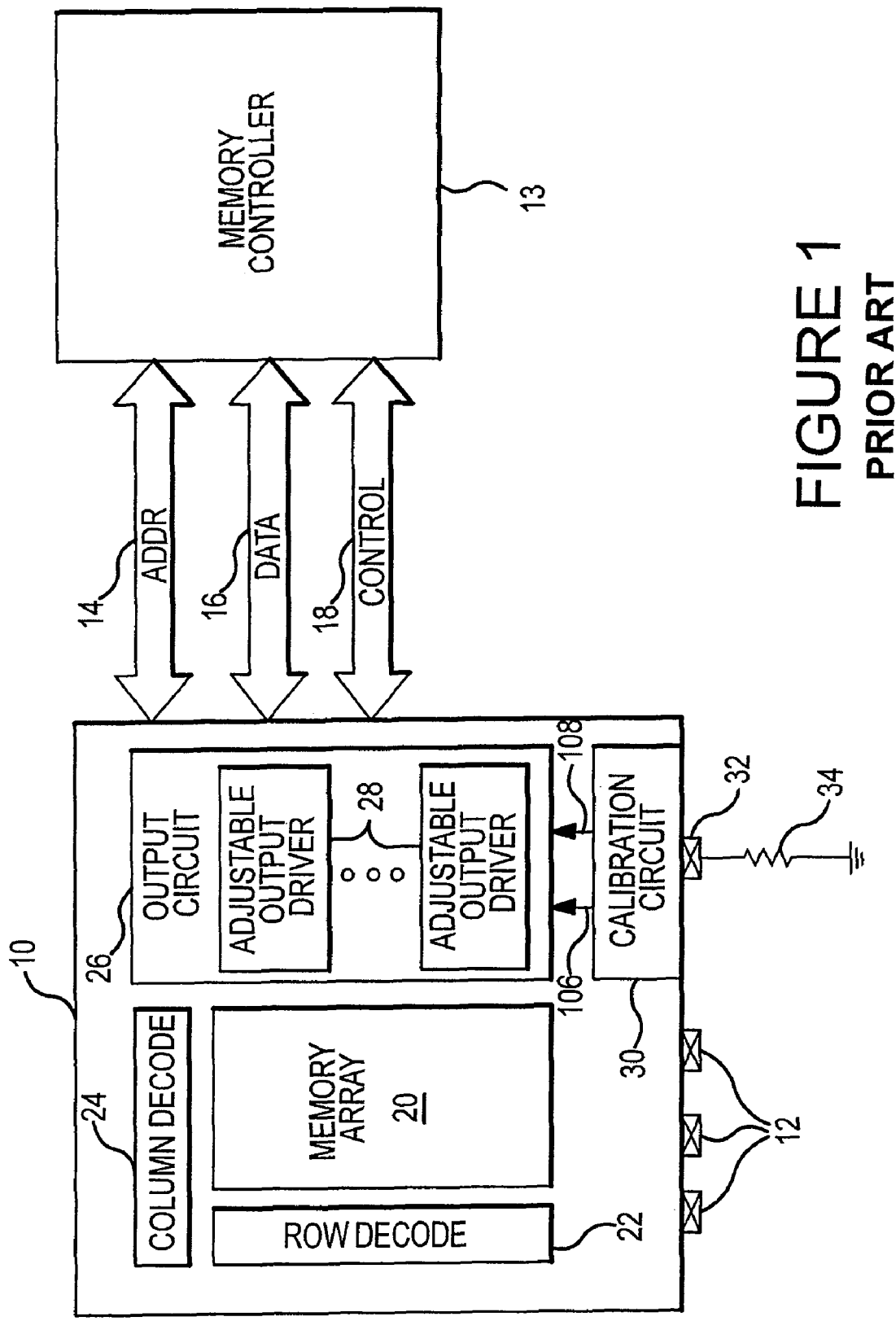
FIG. 1 is an example of a memory system.

However, if an electronic device is equipped with the calibration circuit such as those described above with reference to FIGS. 1 and 2, a connection to an external calibration resistor 34 is required for proper initialization of the device. To indicate a default trim setting should be used instead of calibration to an external resistor, it would be desirable to so indicate by tying the calibration terminal 32 to a power supply voltage such as $V_{CCQ}$ or leave the calibration terminal 32 floating. Allowing the calibration terminal 32 to be tied to a power supply voltage or float, however, results in the need for a method and system to detect a state of the calibration pad. If the calibration pad is coupled to an external resistor, the calibration circuit may perform the calibration procedure described above with reference to FIGS. 1 and 2 to couple calibration control signals to adjust the impedance of one or more output drivers. However, if the calibration pad is not coupled to an external resistor, a default calibration setting should be used.

The implementation of circuitry to assess the state of the calibration pad poses several challenges. First, any time added to the calibration procedure may not be desirable due to the tight timing requirements that may exist for the electronic device. Accordingly, it may not be desirable to spend time detecting the state of the calibration terminal prior to the start of the calibration procedure. Second, if a circuit were to continuously monitor the state of the calibration terminal, it may consume an unacceptable amount of current.

Figure 3:
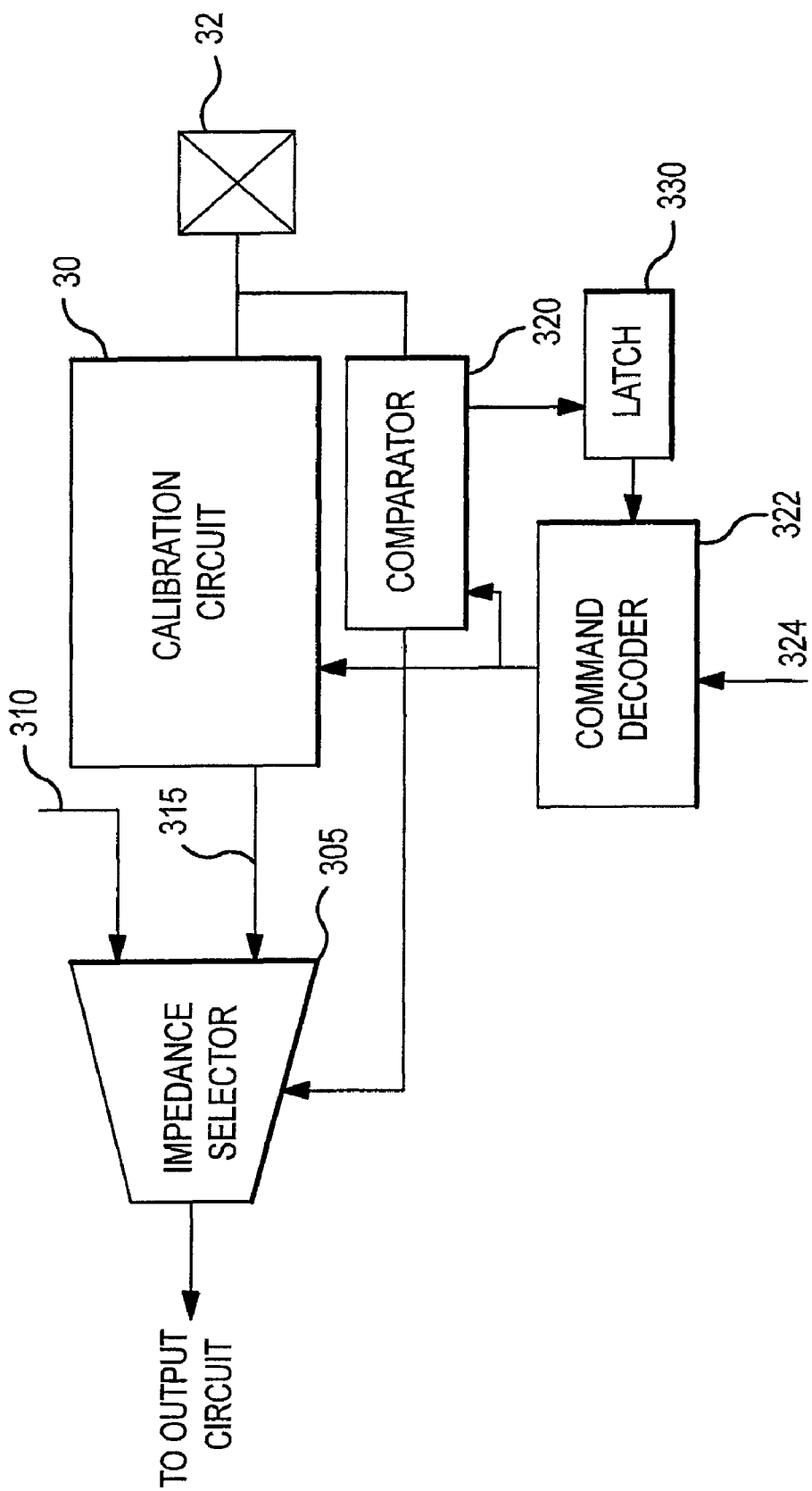
FIG. 3 is a schematic diagram of a calibration system according to an embodiment of the present invention.

Accordingly, a circuit for detecting a state of a calibration terminal according to an embodiment of the present invention is shown in FIG. 3. An impedance selector 305 is configured to couple either a default calibration value 310 or a calibration value 315 generated by the calibration circuit 30, responsive to a signal received from a comparator 320 coupled to the calibration terminal 32. The comparator 320 identifies whether a calibration resistor has been coupled to the calibration terminal 32 or if, instead, the calibration terminal 32 has been tied to a power supply voltage or left floating. When the calibration terminal 32 has been coupled to a calibration resistor, the comparator 320 couples a control signal to the impedance selector 305 indicating the calibration value 315 generated by the calibration circuit 30 should be used. When the calibration terminal 32 has been coupled to a power supply voltage or left floating, the comparator 320 couples a control signal to the impedance selector 305 indicating the default calibration value 310 should be used. The default calibration value 310 may be obtained in any manner, including stored on the electronic device itself or communicated from an external source. Substantially any circuit suitable for determining a voltage level at the calibration terminal 32 may be used to implement the comparator 320.

Figure 4:
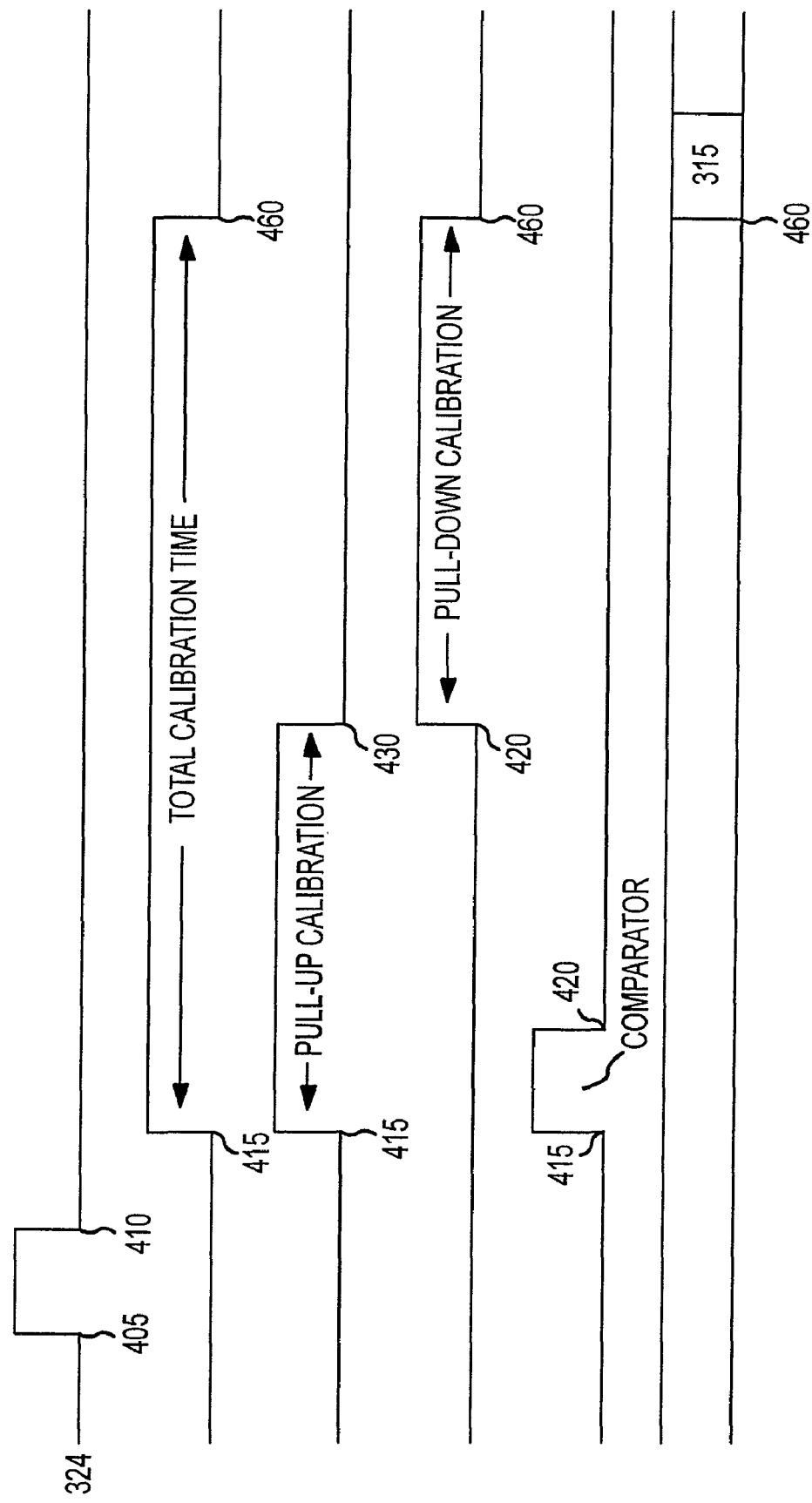
FIG. 4 is a timing diagram illustrating operation of the system of FIG. 3.

A command decoder 322 may be provided to receive and decode a calibration command signal 324 from the memory controller (not shown in FIG. 3). A timing diagram illustrating an example of operation of the circuit of FIG. 3 is shown in FIG. 4. The calibration command signal 324 is received at time 405 through time 410. The calibration command is coupled to both the calibration circuit 30 and the comparator 320. Both the calibration circuit 30 and the comparator 320 begin operation responsive to receipt of the calibration command. As shown in FIG. 4, the calibration circuit 30 performs a calibration routine between time 415 and time 460 while the comparator 320 determines a state of the calibration pad 32 between the time 415 and 420. The calibration time between times 415 and 460 includes a first time for calibrating using the pull-up driver followed by a second time for calibration using the pull-down driver, as generally described above with reference to FIG. 2. The pull-up driver calibration time is between the time 415 and the time 430, and the pull-down calibration time between time 430 and time 460. Following the calibration procedure, at the time 460, the calibration value 315 is generated by the calibration circuit 30. As described above the impedance selector may couple the calibration value 315 or a default calibration value 310 to the output circuit based on the state of the calibration terminal 32 as determined by the comparator 320.

In this manner, the comparator 320 may not continuously monitor the voltage of the calibration terminal 32, but may do so responsive to receipt of the calibration command. Further, the calibration circuit 30 begins the calibration process, examples of which are described above, responsive to the calibration command and in parallel with the comparator 320 making an assessment of the voltage at the calibration terminal. Accordingly, if a calibration resistor has been coupled to the calibration terminal 32, the calibration process performed by the calibration circuit 30 may not be delayed by the comparator 320.

Figure 2:
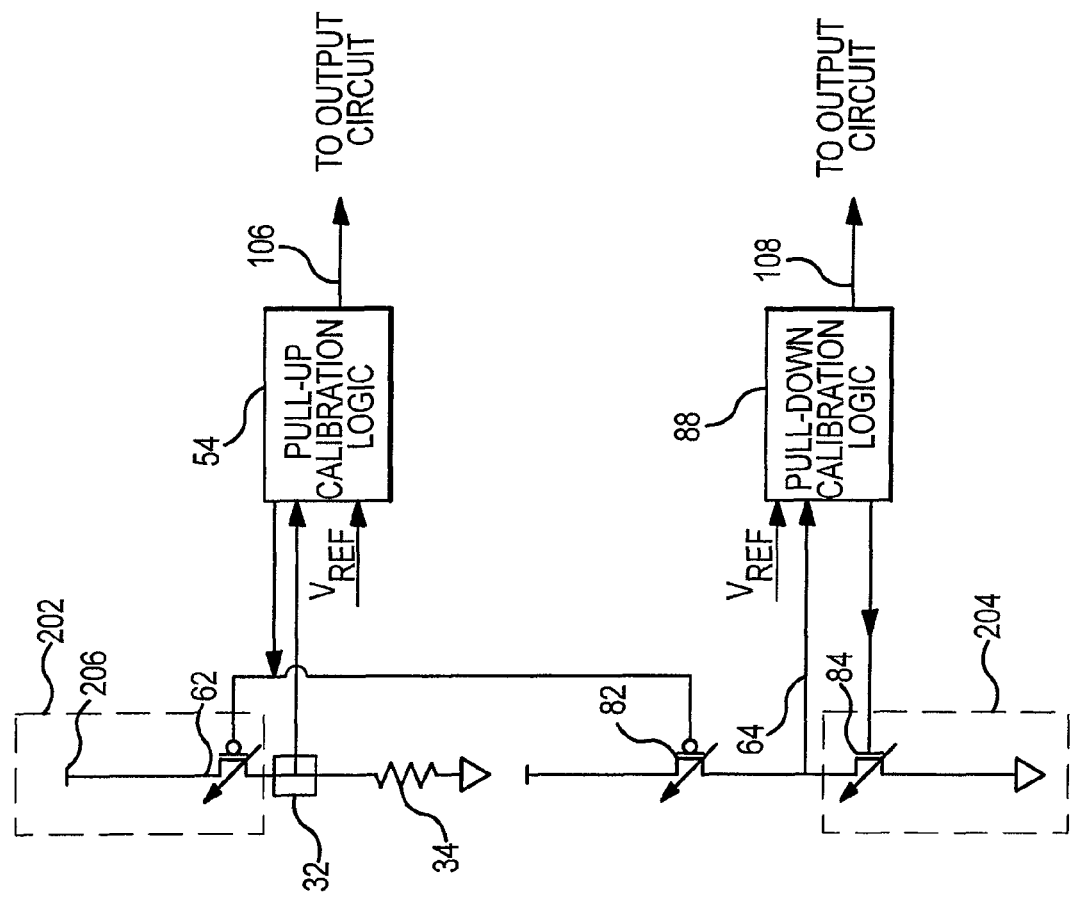
FIG. 2 is a schematic diagram of a calibration circuit.

Further details of an example of operation of the circuit of FIG. 3 will now be described with reference to FIGS. 2-4. The calibration circuit of FIG. 2 is used to implement the calibration circuit 30 of FIG. 3 in this example. When the calibration terminal 32 is coupled to a calibration resistor, the calibration terminal 32 may be at a voltage significantly less than a power supply voltage 206 such as $V_{CCQ}$. Accordingly, the comparator 320 may couple a control signal to the impedance selector 305 indicating the calibration value 315 generated by the calibration circuit 30 should be selected. When, however, the calibration terminal 32 is tied to the power supply voltage, such as $V_{CCQ}$, or is floating, the calibration terminal 32 will have a high voltage, near the power supply voltage, when the pull-up driver 202 is turned on during the time 415 to 430, when the comparator is taking a measurement between time 415 and 420. In this manner, the comparator may couple the control signal to the impedance selector indicating to select the default calibration value 310 when the voltage at the calibration terminal is above a threshold voltage, such as above 0.9 times the power supply voltage, $0.9*V_{CCQ}$ in one embodiment. While an example has been described using an initial pull-up driver and a high power supply voltage $V_{CCQ}$, in some embodiments, the implementation of the calibration circuit, comparator, or both may be such that the pull-down driver is coupled to the calibration terminal 32 and a low voltage on the calibration terminal 32 indicates the terminal is coupled to a power supply voltage or is floating. In such an embodiment, the comparator 320 may couple the control signal to the impedance selector 305 indicating use of the default calibration value 310 when the voltage at the calibration terminal is lower than a threshold voltage.

The comparator 320 may also set a latch 330 based on the state of the calibration pad 32. If the calibration pad 32 was coupled to a calibration resistor, the latch may be set to one state, while if the calibration pad 32 was coupled to a power supply voltage or was floating, the latch 330 may be set to a different state. In this manner, the state of the calibration pad can be remembered between calibration routines. The latch 330 may be set following one calibration routine, and the next time through, the state of the latch 330 may determine which value is selected by the impedance selector 305. That is, if the comparator determines the calibration terminal 32 is coupled to a power supply voltage or is floating, indicating a desire to use a default calibration value, further calibration commands received by the command decoder 322 may not be coupled to the calibration circuit 30 and comparator 320. This may save time and power in embodiments where repeated calibration commands are received.

From the foregoing it will be appreciated that, although specific embodiments of the invention have been described herein for purposes of illustration, various modifications may be made without deviating from the spirit and scope of the invention.

What is claimed is:

1. A method for calibrating an output circuit, the method comprising:
   initiating a calibration procedure in an electronic device, the calibration procedure configured to generate a calibration value based in part on an impedance at a calibration terminal of an electronic device; and
   selecting between the calibration value and a default value based in part on the presence or absence of a calibration resistor at the calibration terminal.

2. The method of claim 1, wherein the act of initiating the calibration procedure occurs responsive to receipt of a calibration command.

3. The method of claim 2, further comprising monitoring an electronic property of the calibration terminal responsive to receipt of the calibration command.

4. The method of claim 3, wherein the electronic property comprises voltage.

5. The method of claim 3, wherein the act of selecting between the calibration value and a default value comprises selecting the calibration value when the electronic property of the calibration terminal satisfies a condition and selecting the default value when the electronic property of the calibration terminal fails to satisfy the condition.

6. The method of claim 5, wherein the condition comprises a comparison with a threshold value of the electronic property.

7. The method of claim 3, wherein the act of monitoring an electronic property of the calibration terminal occurs at least in part simultaneously with the calibration procedure.

8. The method of claim 3, further comprising determining the presence or absence of a calibration resistor at the calibration terminal.

9. The method of claim 1, further comprising adjusting an impedance of the output circuit based, at least in part, on the selected value.

10. A circuit for selecting a calibration value, the circuit comprising:
    a calibration circuit including a first input terminal and a first output terminal, the first input terminal coupled to a calibration terminal, the calibration circuit configured to provide a first output signal at the first output terminal, the first output signal indicative of a first calibration value based, at least in part, on an impedance of the calibration terminal;
    a comparator including a second input terminal and a second output terminal, the second input terminal coupled to the calibration terminal, the comparator configured to monitor an electrical property of the calibration terminal and provide a second output signal at the second output terminal, the second output signal indicative of a state of the calibration terminal; and
    an impedance selector including a third input terminal coupled to the first output terminal and configured to receive the first output signal, a fourth input terminal configured to receive a signal indicative of a second calibration value, a control terminal coupled to the second output terminal and configured to receive the second output signal, and a third output terminal configured to provide a third output signal indicative of either the first or second calibration value in accordance with the second output signal.

11. The circuit of claim 10, wherein the control terminal comprises a first control terminal, and wherein the calibration circuit includes a second control terminal and the command decoder includes a third control terminal, wherein the first and second control terminals are configured to receive a command signal, and wherein the calibration circuit and the comparator are configured to enable responsive to receipt of the command signal.

12. The circuit of claim 11, further comprising a command decoder configured to provide the command signal to the calibration circuit and the comparator.

13. The circuit of claim 10, further comprising a latch coupled to the comparator, the latch configured to store the state of the calibration terminal.

14. The circuit of claim 10, wherein the comparator is configured to generate the second output signal during at least a portion of time the calibration circuit is generating the first output signal.

15. The circuit of claim 10, wherein the calibration circuit includes a pull-up driver configured to couple to the calibration terminal and a pull-down driver configured to couple to the calibration terminal.

16. The circuit of claim 15, wherein the comparator is configured to monitor a voltage of the calibration terminal during at least a portion of time the pull-up driver is coupled to the calibration terminal.

17. The circuit of claim 16, wherein the comparator is configured to monitor a voltage of the calibration terminal during at least a portion of the time the pull-down driver is coupled to the calibration terminal.

18. The circuit of claim 10, wherein the electrical property comprises a voltage.

19. The circuit of claim 10, further comprising an adjustable output driver having a fourth input terminal coupled to the third output terminal and configured to receive the third output signal indicative of either the first or second calibration value.

20. The circuit of claim 10, wherein the comparator is configured to compare a value of the electrical property of the calibration terminal with a threshold value.

* * * * *